United States Patent
Hara

(10) Patent No.: US 8,054,136 B2
(45) Date of Patent: Nov. 8, 2011

(54) ELECTRONIC CIRCUIT

(75) Inventor: Hiroshi Hara, Kanagawa (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 0 days.

(21) Appl. No.: 12/721,918

(22) Filed: Mar. 11, 2010

(65) Prior Publication Data
US 2010/0231295 A1   Sep. 16, 2010

(30) Foreign Application Priority Data

Mar. 12, 2009   (JP) ................... 2009-058819

(51) Int. Cl.
*H03F 3/08* (2006.01)
(52) U.S. Cl. .................. 330/308; 330/214 A
(58) Field of Classification Search .............. 330/308; 250/214 A
See application file for complete search history.

(56) References Cited

U.S. PATENT DOCUMENTS

| | | | | |
|---|---|---|---|---|
| 5,430,766 A | * | 7/1995 | Ota et al. | 375/318 |
| 5,822,104 A | * | 10/1998 | Saito | 398/202 |
| 6,072,366 A | * | 6/2000 | Maeda et al. | 330/254 |
| 6,275,541 B1 | * | 8/2001 | Nagahori et al. | 375/318 |
| 7,763,838 B2 | * | 7/2010 | Suzuki et al. | 250/214 A |
| 2009/0310979 A1 | * | 12/2009 | Hara | 398/209 |
| 2010/0226495 A1 | * | 9/2010 | Kelly et al. | 380/30 |

FOREIGN PATENT DOCUMENTS

JP   3-97304 A   4/1991

* cited by examiner

*Primary Examiner* — Patricia Nguyen
(74) *Attorney, Agent, or Firm* — Westerman, Hattori, Daniels & Adrian, LLP

(57) ABSTRACT

An electronic circuit includes a transimpedance amplifier, a bypass circuit that allows a part of an input signal to be applied to the transimpedance amplifier to flow through the bypass circuit so as to bypass the transimpedance amplifier on the basis of a control signal, and a control signal circuit that includes a hold circuit having a time constant that is variable on the basis of a time constant control signal and generates the control signal.

7 Claims, 10 Drawing Sheets

ELECTRONIC CIRCUIT

CROSS-REFERENCE TO RELATED APPLICATION

This application is based upon and claims the benefit of priority of the prior Japanese Patent Application No. 2009-058819, filed on Mar. 12, 2009, the entire contents of which are incorporated herein by reference.

BACKGROUND (i) Technical Field

The present invention relates to electronic circuits, and more particularly, to an electronic circuit that causes an input signal applied via an input terminal to bypass an amplifier on the basis of the output thereof.

(ii) Related Art

There is known an automatic gain control (AGC) circuit that controls the gain of an amplifier on the basis of the output thereof. Japanese Patent Application Publication No. 3-97304 discloses an AGC circuit that causes an input current applied to a transimpedance amplifier (TIA) to bypass the TIA on the basis of the output of the TIA. The TIA converts the output current of a light-receiving element such as a photodiode into a voltage, and amplifies the voltage.

SUMMARY

An object of the present invention is to appropriately control the amplifier in accordance with an input signal applied to the amplifier.

According to an aspect of the present invention, there is provided an electronic circuit including: a transimpedance amplifier; a bypass circuit that allows a part of an input signal to be applied to the transimpedance amplifier to flow through the bypass circuit so as to bypass the transimpedance amplifier on the basis of a control signal; and a control signal circuit that includes a hold circuit having a time constant that is variable on the basis of a time constant control signal and generates the control signal.

DETAILED DESCRIPTION

Figure 1A:
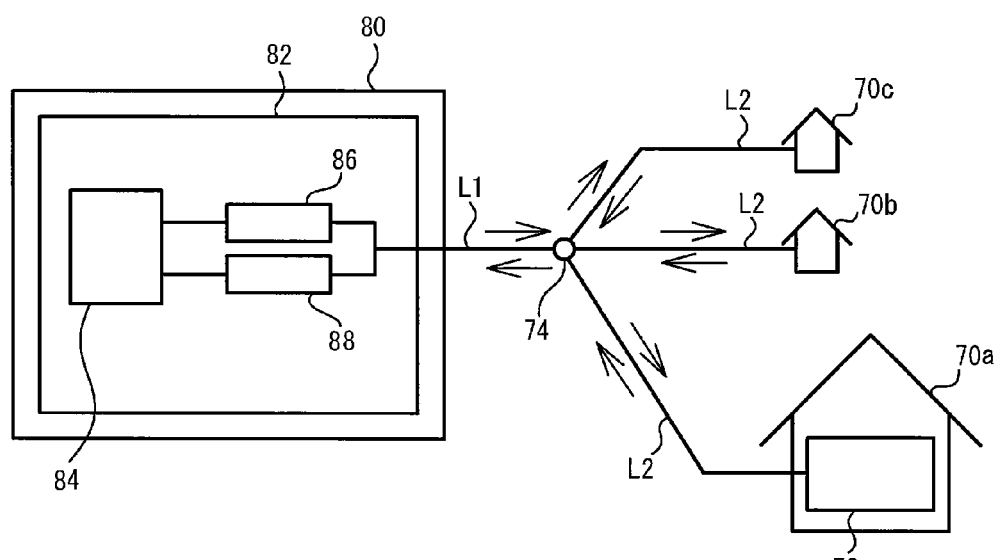
FIG. 1A is a block diagram of a PON (passive optical network) type system, and FIG. 1B schematically depicts an optical signal in optical communications of the PON type with time.

A description will now be given of a communication system of the type, which is an exemplary communication system to which the present invention can be applied. FIG. 1A is a block diagram of a PON type system. A station-side communication device 82 in a station 80 is connected to home-side communication devices 72 in homes 70a through 70c by communication lines L1 and L2, which may be optical fibers. The single communication line L1 is used to connect the station-side communication device 82 and an optical splitter 74. The communication lines L2 are respectively used to connect the optical splitter 74 and the home-side communication devices 72. The optical splitter 74 is used to connect the communication lines L1 and L2 so that signals can be mutually transmitted between the station-side communication device 82 and the home-side communication devices in the homes 70a through 70c. The station-side communication device 82 includes a control circuit 84, a transmitter unit 86 and a receiver unit 88. The transmitter unit 86 sends optical signals to the home-side communication devices 72. The receiver unit 88 is a receiver circuit that receives optical signals from the home-side communication devices 72. The control circuit 84 controls the transmitter unit 86 and the receiver unit 88.

Figure 1B:
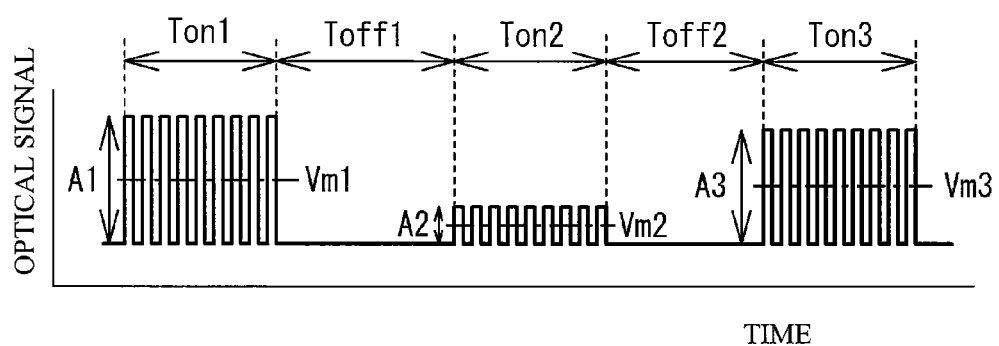

FIG. 1B illustrates optical signals that are input to a light-receiving element (photodiode 60 in FIG. 2) of the receiver unit 88 on the time axis. An optical signal from the home-side communication device 72 in home 70a is input to the receiver unit 88 during a period of time Ton1. No signal is input during a period of time Toff1. An optical signal from the home-side communication device 72 (not illustrated) in home 70b is input to the receiver unit 88 during a period of time Ton2. No signal is input during a period of time Toff2. An optical signal from the home-side communication device 72 (not illustrated) in home 70c is input to the receiver during a period of time Ton3. The signals from the home-side communication devices 72 may have different amplitudes of the respective output signals, and the optical signals on the communication lines L2 may have different losses. As illustrated in FIG. 1B, the optical signals received during the periods of time (input signal periods) Ton1, Ton2 and Ton3 have different amplitudes A1, A2 and A3, respectively. The receiver unit 88 for use in PON receives the optical signals with different amplitudes irregularly. The periods of time Toff1 and Toff2 are interval periods during which the communication line L2 connected to the communication line L1 is switched to another one by the optical splitter 74. An amplifier circuit used in the receiver unit 88 may be an automatic gain control circuit because the receiver unit 88 receives the optical signals with different amplitudes.

Figure 2:
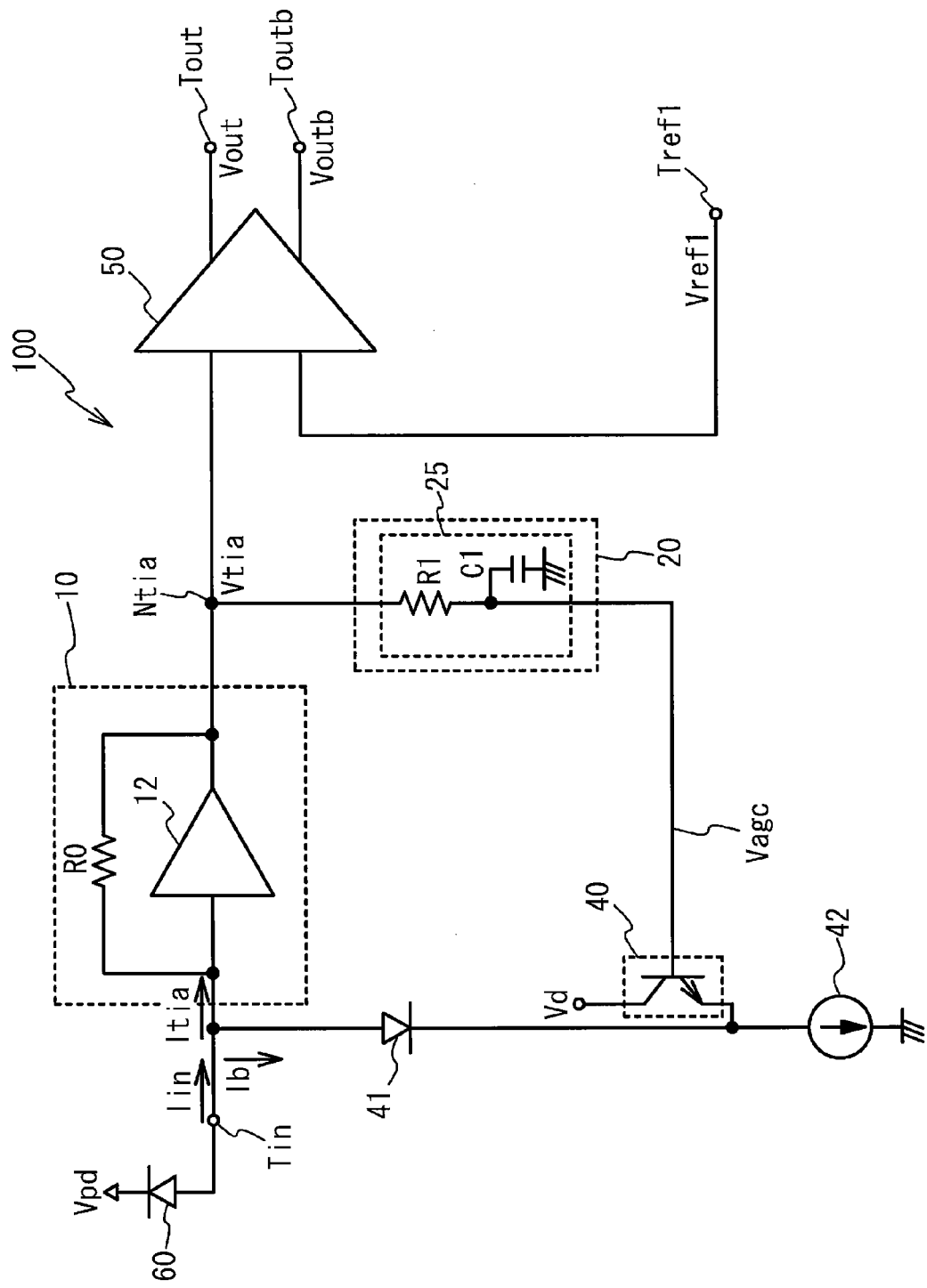
FIG. 2 is a circuit diagram of an amplifier circuit in a comparative example.

A comparative example of the amplifier circuit that may be used in the receiver unit 88 is now described. FIG. 2 is a circuit diagram of a comparative example of the amplifier circuit, which may be used in the receiver unit 88. An amplifier circuit 100 of the comparative example includes a transimpedance amplifier 10, a control signal circuit 20, a bypass circuit 40 and a differential amplifier 50. The transimpedance amplifier 10 has an input terminal Tin to which the anode of a photodiode 60 is connected. The cathode of the photodiode 60 is connected to a power source Vpd. An input signal (input current) Iin, which is a communication signal applied to the input terminal Tin, is an input signal (input current) Itia of the transimpedance amplifier 10.

The transimpedance amplifier 10 has an amplifier 12 and a feedback resistor R0, and functions as a transimpedance amplifier that converts current into voltage and amplifies the voltage. The transimpedance amplifier 10 outputs an output signal (output voltage) to a node Ntia. The differential amplifier 50 amplifies the difference between a voltage Vtia of the node Ntia and a reference signal (reference voltage) Vref1 applied to a reference terminal Tref1. When the signal Vtia is greater than the reference signal Vref1, the differential amplifier 50 outputs a positive output signal Vout to an output terminal Tout, and outputs a negative signal Voutb to an output terminal Toutb. In contrast, when the signal Vtia is smaller than the reference signal Vref1, the differential amplifier 50 outputs the negative and positive output signals Vout and Voutb to the output terminals Tout and Toutb, respectively. The output signals Vout and Voutb are complementary signals. The differential amplifier 50 may function as a limiter amplifier, which may result in the output signals Vout and Voutb having rectangular waveforms.

The control signal circuit 20 generates a control signal (control voltage) Vagc on the basis of the output signal Vtia of the transimpedance amplifier 10. The control signal circuit 20 includes a resistor R1 and a capacitor C1. The resistor R1 is connected in series between the node Ntia and the bypass circuit 40, and the output signal Vtia from the transimpedance amplifier 10 is applied thereto. The capacitor C1 is connected between the end of the resistor R1 closer to the bypass circuit 40 and ground, and stores a charge resulting from the current flowing in the resistor R1. The resistor R1 and the capacitor C1 form a hold circuit 25. The control signal circuit 20 averages the output signal Vtia by a time constant defined by the resistor R1 and the capacitor C1, and outputs the control signal Vagc. The control signal Vagc produced by the control signal circuit 20 is used to control the bypass circuit 40, as will be described later.

A diode 41 and a current source 42 are connected in series between the input terminal Tin and ground. The anode of the diode 41 is connected to the input terminal Tin, and the cathode of the diode 41 is connected to the current source 42. The diode 41 functions to prevent current from flowing backwards. The bypass circuit 40 includes a transistor. The collector of the transistor is connected to a power source Vd. The emitter of the transistor is connected to a node between the diode 41 and the current source 42. The base of the transistor is supplied with the control signal Vagc. When the control signal Vagc decreases, the bypass circuit 40 reduces the potential of the node between the diode 41 and the current source 42, and causes a part of the input signal Iin to bypass the transimpedance amplifier 10 as bypass current Ib. Thus, the bypass circuit 40 allows the bypass current Ib to flow to the ground on the basis of the control signal Vagc. Thus, the signal applied to the transimpedance amplifier 10 is reduced, and a resultant signal Itia is applied to the transimpedance amplifier 10. Thus, the gain of the amplifier circuit 100 is substantially reduced.

Figure 3:
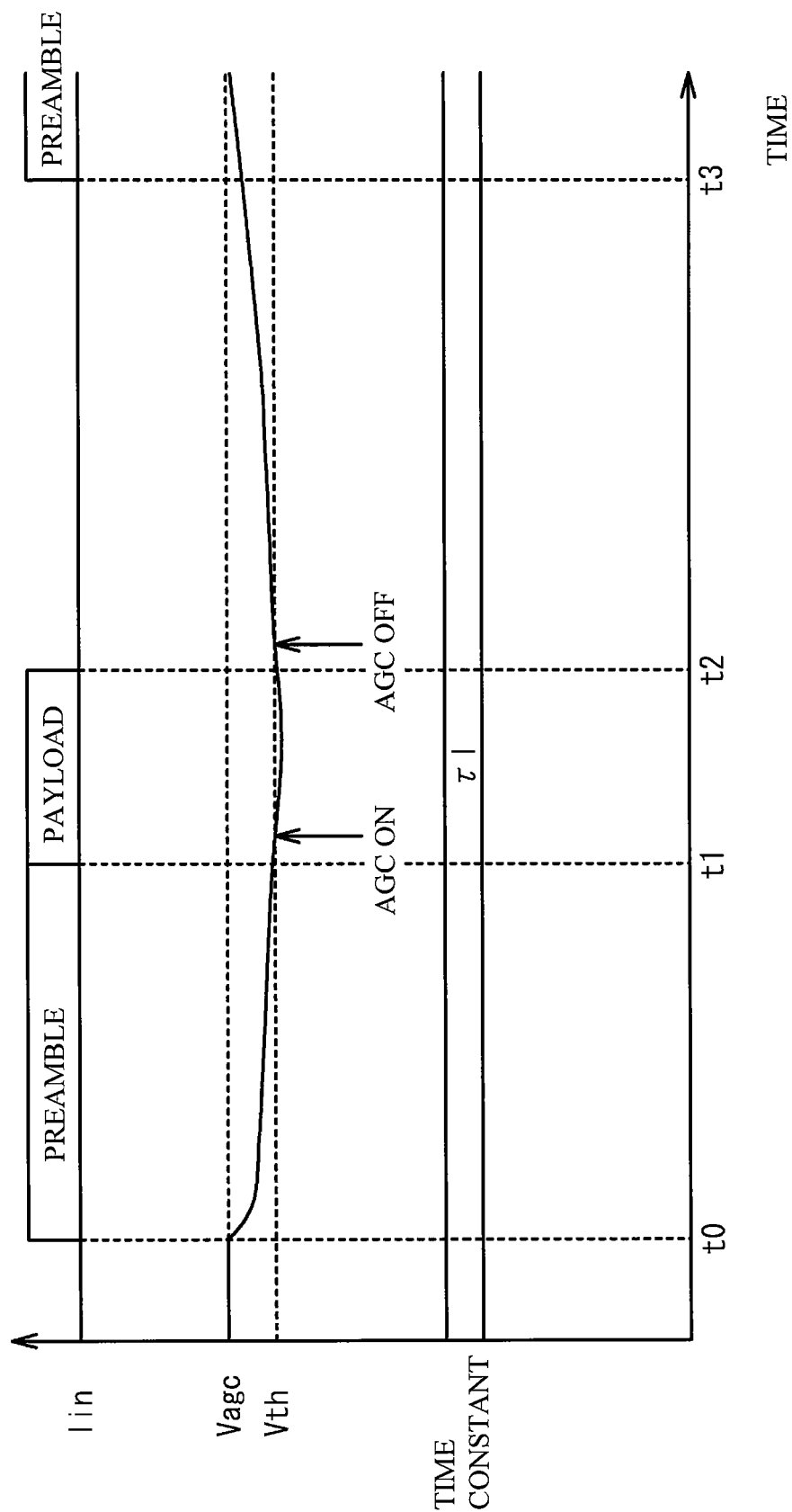
FIG. 3 is a timing chart of an operation of the amplifier circuit in the comparative example.

FIG. 3 is a timing chart of the comparative example. FIG. 3 illustrates changes of the input signal Iin, the control signal Vagc, and the time constant of the control signal circuit 20 with time. The input signal includes a preamble signal and a payload signal. The preamble signal is used to stabilize the control signal Vagc before the payload signal is input. In other words, the preamble signal averages the signal Vtia. The payload signal is used to send and receive data. At time t0, inputting of the preamble signal starts. At time t1, the inputting of the preamble signal ends, and inputting of the payload signal starts. At time t2, the inputting of the payload signal ends. At time t3, inputting of the next preamble signal starts. In the comparative example, the time constant of the control signal circuit 20 is fixed to τl.

At time t0, the control signal Vagc is the signal Vtia in the initial state before the input signal is applied. When the inputting of the preamble signal starts, the control signal Vagc becomes closer to the average value of the signal Vtia due to the time constant τl. When the control signal Vagc becomes smaller than a threshold level Vth, the bypass circuit 40 starts to allow the bypass current Ib to flow. That is, the automatic gain control is initiated (AGC ON). At time t2, the payload signal ends, and the signal Vtia starts to increase. The control signal Vagc returns to the signal Vtia in the initial state due to the time constant τl. When the control signal Vagc becomes greater than the threshold voltage Vth, the bypass circuit 40 causes the bypass current to stop flowing. Thus, the automatic gain control is ended (AGC OFF). When the input signal has a large amplitude, the control signal Vagc becomes smaller, and the bypass current Ib is increased. Thus, the gain of the amplifier circuit 100 is reduced. The amplifier circuit 100 adjusts the gain on the basis of the amplitude of the input signal.

Figure 4:
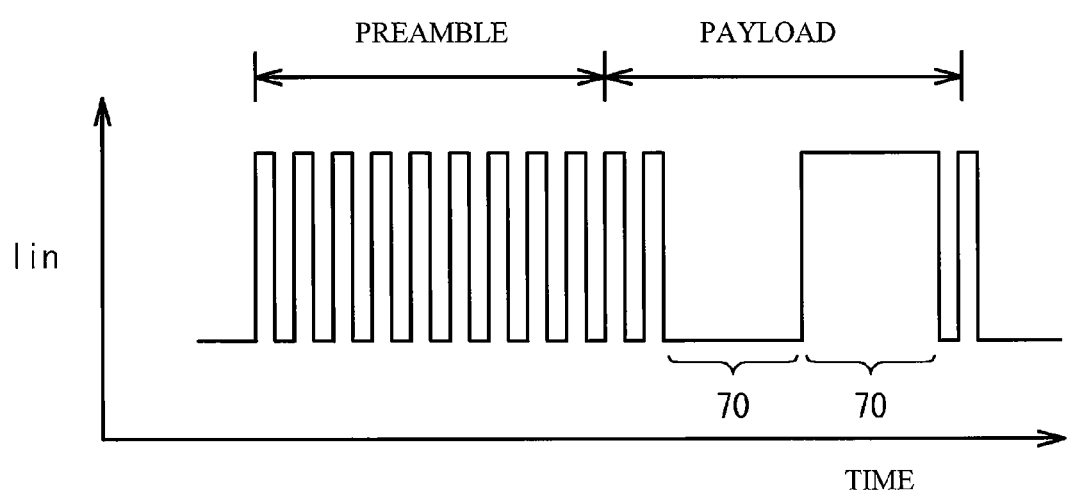
FIG. 4 illustrates an example of an input signal.

FIG. 4 illustrates an example of the input signal Iin. The input signal is a data train configured to include the preamble period and the payload period following the preamble period. The preamble signal is directed to stabilizing the control signal Vagc, and the high level and the low level appear alternately with constant periods. As illustrated in FIG. 1B, the input signal may have different amplitudes, and the control signal Vagc is stabilized before the preamble signal is input. The high level and the low level of the payload signal appear irregularly, and identical bits may occur successively in the input signal. In this case, a high-level period or a low-level period continues for a while, as indicated by reference numerals 70.

If the control signal Vagc fluctuates in a case where the payload signal has a low-level or high-level long-continued period of time, the gain of the amplifier circuit 100 may be varied and the amplifier circuit 100 may become unstable. Thus, the resistor R1 is increased to increase the time constant τl. However, if the time constant τl is too large, it will take a longer time to stabilize the control signal Vagc, and the automatic gain control will be started after time t1 when the preamble signal ends in FIG. 3. Further, the control signal Vagc may not return to the initial state before the time t3 when the inputting of the next signal starts. It is thus preferable to provide a reset circuit that brings the control signal Vagc back to the initial state.

As described above, the comparative example cannot stabilize the control signal Vagc during the period of the payload signal if the time constant of the control signal circuit 20 is reduced. In contrast, when the time constant of the control signal circuit 20 is increased, the bypass circuit 40 cannot be stabilized during the period of the preamble signal. According to an aspect of an embodiment described below, the above-described problems are solved.

First Embodiment

Figure 5:
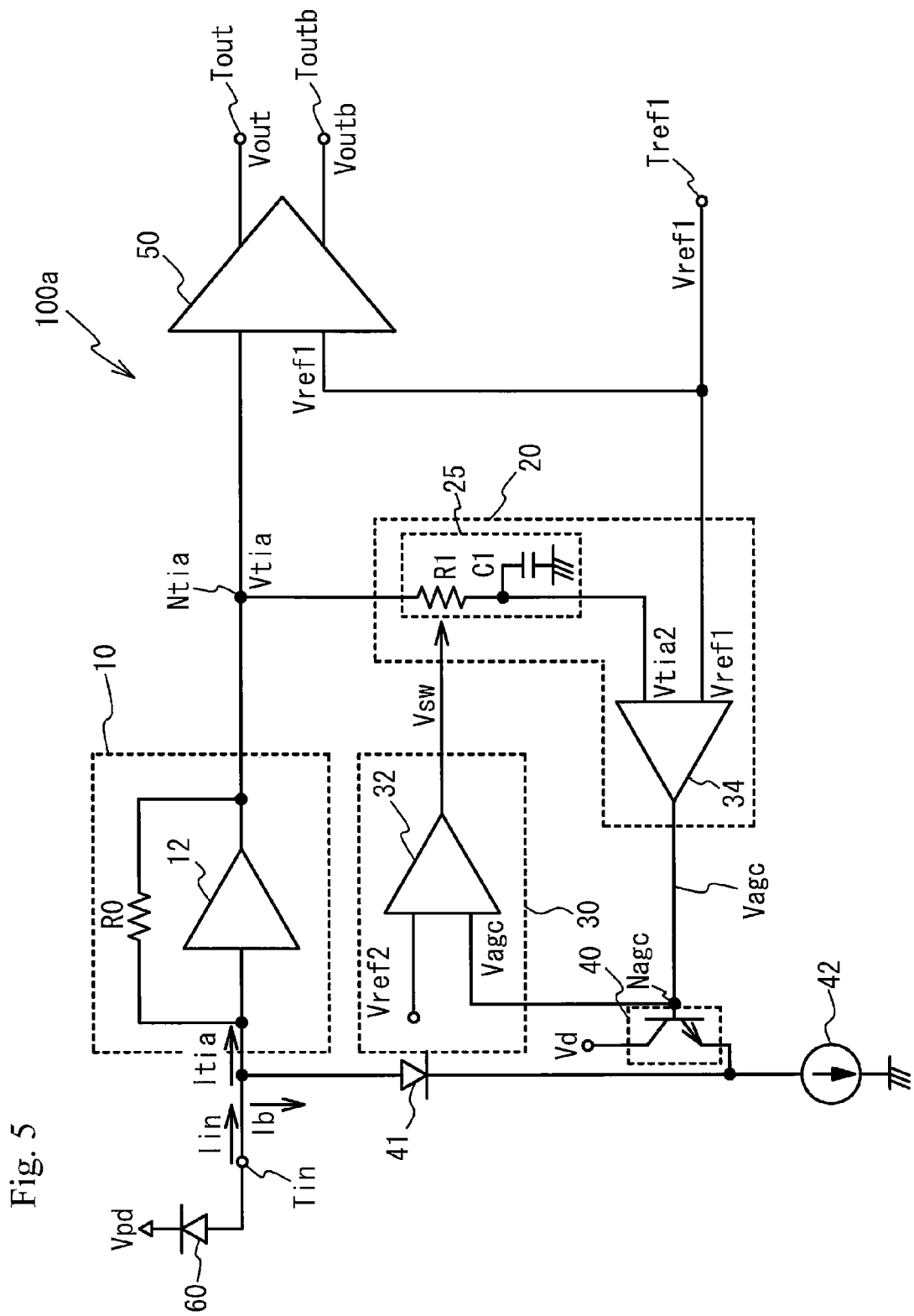
FIG. 5 is a circuit diagram of an amplifier circuit in accordance with a first embodiment.

FIG. 5 is a circuit diagram of an amplifier circuit 100a in accordance with a first embodiment. The control signal circuit 20 includes a differential circuit (comparator circuit) 34. The resistor R1 of the hold circuit 25 is formed by a variable resistor. There is provided a time constant control circuit 30, which includes a differential amplifier 32. The differential amplifier 34 amplifies the difference between an output signal (output voltage) Vtia2 of the variable resistor R1 and the capacitor C1 and the reference signal Vref1, and outputs the control signal Vagc to a node Nagc. The node Nagc is connected to the base of the transistor of the bypass circuit 40. The differential amplifier 32 of the time constant control circuit 30 compares the control signal Vagc and the reference signal (reference voltage) Vref2. When the control signal Vagc is smaller than the reference signal Vref2, the time constant control circuit 30 sets a time constant control signal Vsw to the low level. In contrast, when the control signal Vagc is greater than the reference signal Vref2, the time constant control circuit 30 sets the time constant control signal Vsw to the high level.

Figure 6:
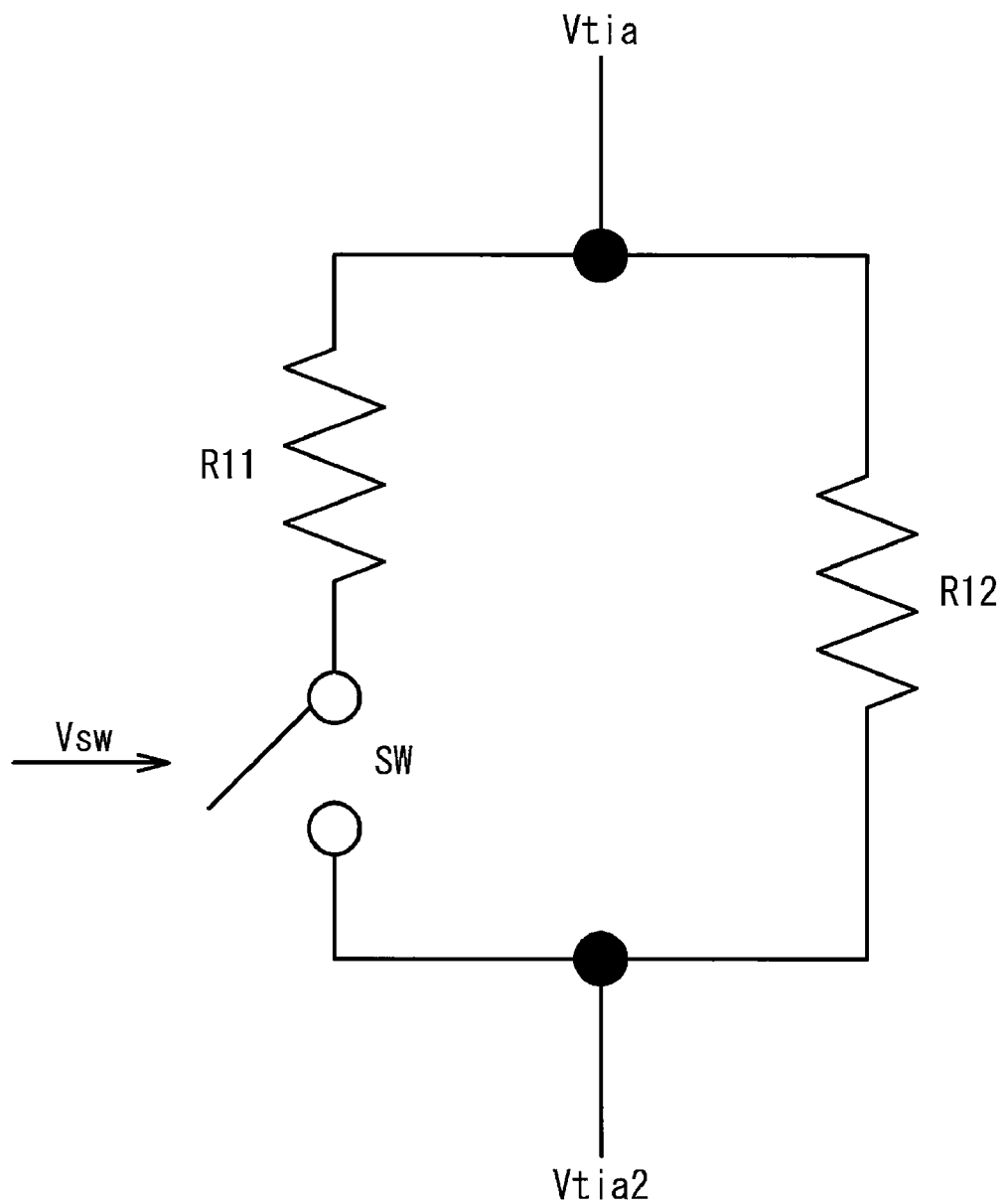
FIG. 6 is a circuit diagram of a variable resistor.

FIG. 6 is a circuit diagram of an exemplary structure of the variable resistor R1. A resistor R11 and a switch SW are connected in series, and a resistor R12 is connected in parallel with the series circuit of the resistor R11 and the switch SW. The resistor R12 is greater than the resistor R11. When the time constant control signal Vsw is high, the switch SW is ON, and the variable resistor R1 has a reduced resistance. Thus, the time constant of the hold circuit 25 is changed to a smaller value τs. When the time constant control signal Vsw is low, the switch SW is OFF, and the variable resistor R1 has an increased resistance. Thus, the time constant of the hold circuit 25 is changed to a greater value τl. The other structural parts of the circuit illustrated in FIG. 6 are similar to those of the comparative circuit illustrated in FIG. 2.

Figure 7:
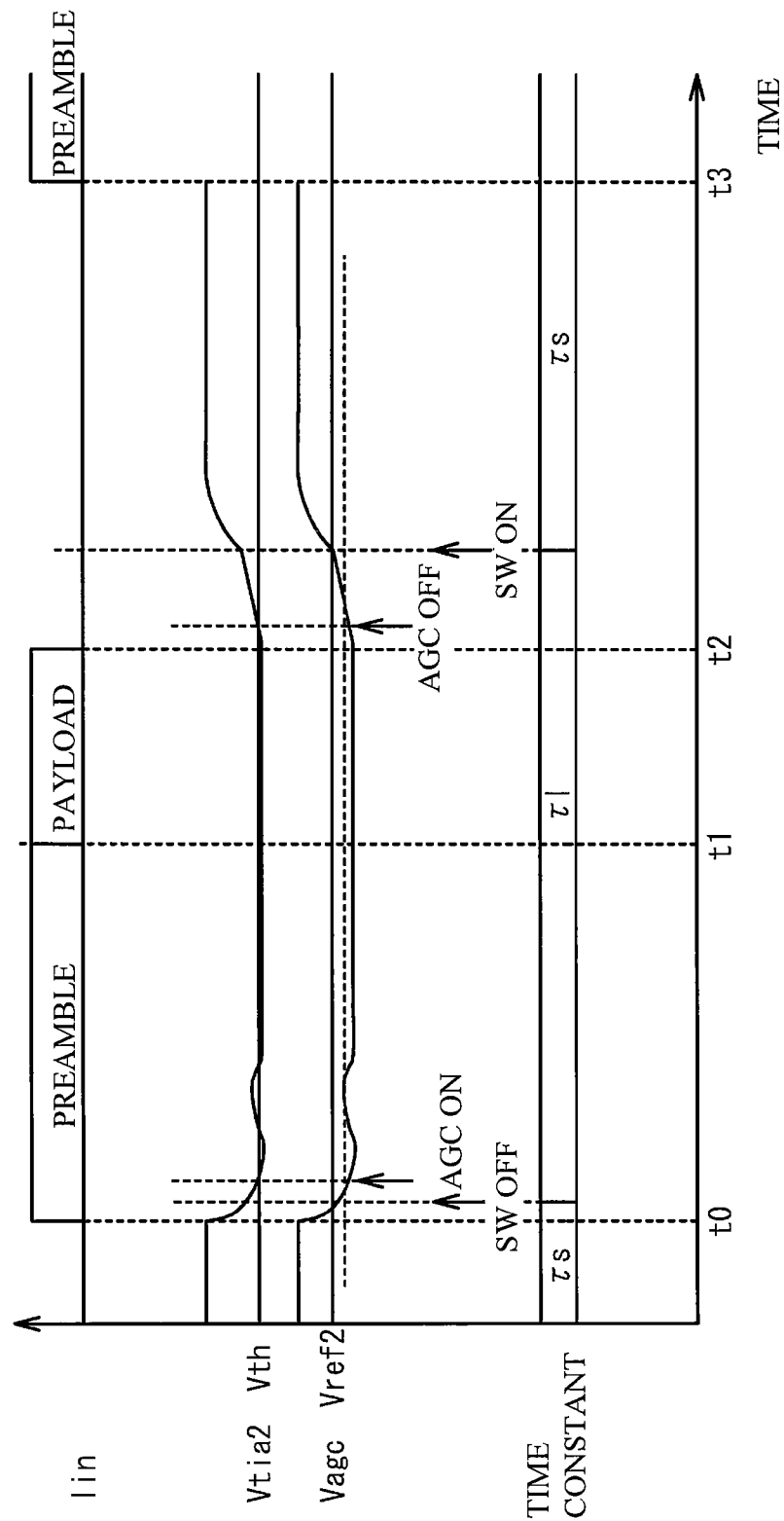
FIG. 7 is a timing chart of an amplifier circuit in accordance with the first embodiment.

FIG. 7 is a timing chart that depicts an operation of the first embodiment. FIG. 7 illustrates the input signal Iin, the signal Vtia2, the control signal Vagc and the time constant of the hold circuit 25 with time. At time t0, the time constant control signal Vsw is high and the time constant is a small period of τs. The signal Vtia2 is the signal Vtia before the input signal is applied. When the inputting of the preamble signal starts, the signal Vtia2 starts to approach the mean value of the signal Vtia with the time constant τs. When the signal Vtia2 becomes smaller than the threshold value Vth, the bypass circuit 40 allows the bypass current to flow, and thus starts the automatic gain control. Meanwhile, the control signal Vagc acts like the signal Vtia2. When the control signal Vagc becomes smaller than the reference signal ref2, the switch SW is turned OFF, and the time constant τs switched to a large period of τl. When the payload signal ends at time t2, the signal Vtia2 and the control signal Vagc increase gradually. When the signal Vtia2 becomes greater than the threshold value Vth, the bypass circuit 40 cuts off the bypass current Ib, and the automatic gain control is thus terminated. When the control signal Vagc becomes greater than the reference signal Vref2, the time constant of the control signal circuit 20 is switched to the small period τs. Thus, the signal Vtia2 and the control signal Vagc return to the initial states quickly.

According to the first embodiment, the time constant control circuit 30 changes the resistance value of the variable resistor R1 on the basis of the control signal Vagc, so that the time constant of the hold circuit 25 can be controlled. It is thus possible to appropriately control the time constant of the hold circuit 25.

The time constant control circuit 30 controls the resistance value of the variable resistor R1 so as to increase the resistance value beyond that in the initial state, when the output signal Vtia has a great change with respect to the initial state before the input signal Iin is applied. For example, the time constant control circuit 30 increases the variable resistor R1 when the change of the output signal Vtia is greater than a predetermined quantity (which corresponds to the reference signal Vref2). Thus, the time constant of the hold circuit 25 is controlled (changed from τs to τl). It is thus possible to increase the time constant of the hold circuit 25 after the input signal Iin is applied.

The bypass circuit 40 increases the amount of the bypass current from the input signal In as the change of the output signal Vtia becomes great. For example, the bypass circuit 40 allows the input signal Iin to flow therein when the change of the output signal Vtia becomes greater than a predetermined quantity (which corresponds to the threshold value Vth). Thus, the input signal Iin is caused to flow in the bypass circuit 40 to bypass the transimpedance amplifier 10, the gain of which is thus controlled.

The control signal circuit 20 outputs a signal that starts bypassing when the differential amplifier 34 (comparator circuit) detects a change in which the output signal of the hold circuit 25 becomes equal to or greater than the threshold value Vth.

The time constant control circuit 30 increases the resistance value of the variable resistor R1 so as to exceed the resistance value of the initial state during a time when the preamble signal is input (between time t0 and t1 in FIG. 7). Thus, the time constant control signal Vsw is controlled so as to increase the time constant of the hold circuit 25 during the preamble period after the time constant is controlled to be reduced. It is thus possible to stabilize the control signal during the preamble period and to increase the time constant of the hold circuit 25 during the payload period.

The time constant control circuit 30 sets the resistance value of the variable resistor R1 to that in the initial state until the next input signal is applied after the input of the previous input signal is completed (between t2 and t3 in FIG. 7). As described above, the time constant control circuit 30 resets the time constant of the hold circuit 25 during the interval period (between time t2 and t3 in FIG. 7). Thus, there is no longer needed a reset circuit for resetting the control signal Vagc to the initial state.

Preferably, the time constant τs is smaller than the period of the preamble used to stabilize the control signal Vsgc within the preamble signal. Preferably, the time constant τs is longer than the cycles at which the level of the preamble signal is switched to the high or low level in order to prevent the preamble signal from changing in the cycles.

Second Embodiment

Figure 8:
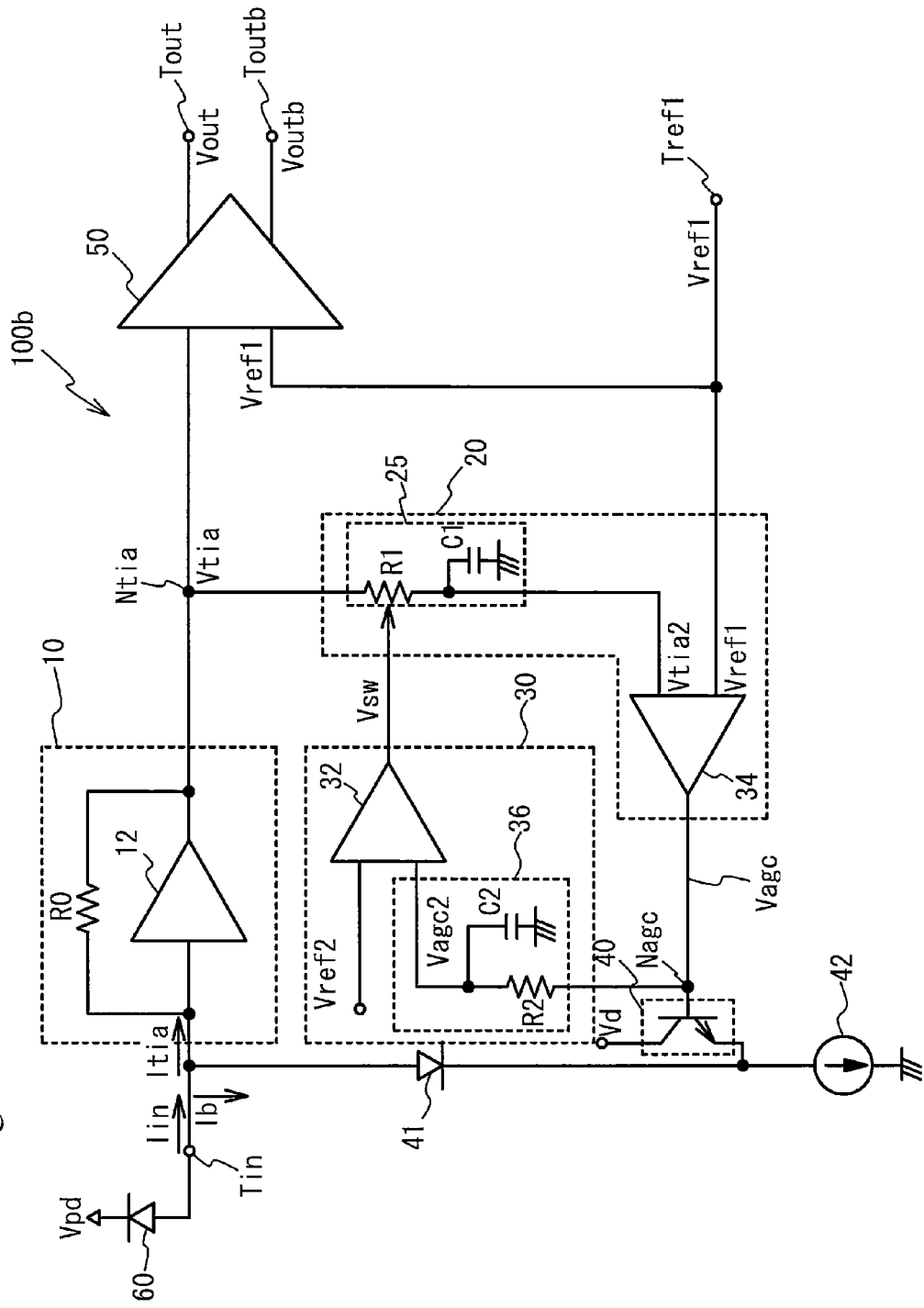
FIG. 8 is a circuit diagram of an amplifier circuit in accordance with a second embodiment.

FIG. 8 is a circuit diagram of an amplifier circuit 100b in accordance with a second embodiment. The time constant control circuit 30 includes a delay circuit 36. The delay circuit 36 includes a resistor R2 and a capacitor C2. The delay circuit 36 delays the control signal Vagc and applies a signal (voltage) Vagc2 to the differential amplifier 32. The other structures of the second embodiment are the same as those of the first embodiment illustrated in FIG. 5.

Figure 9:
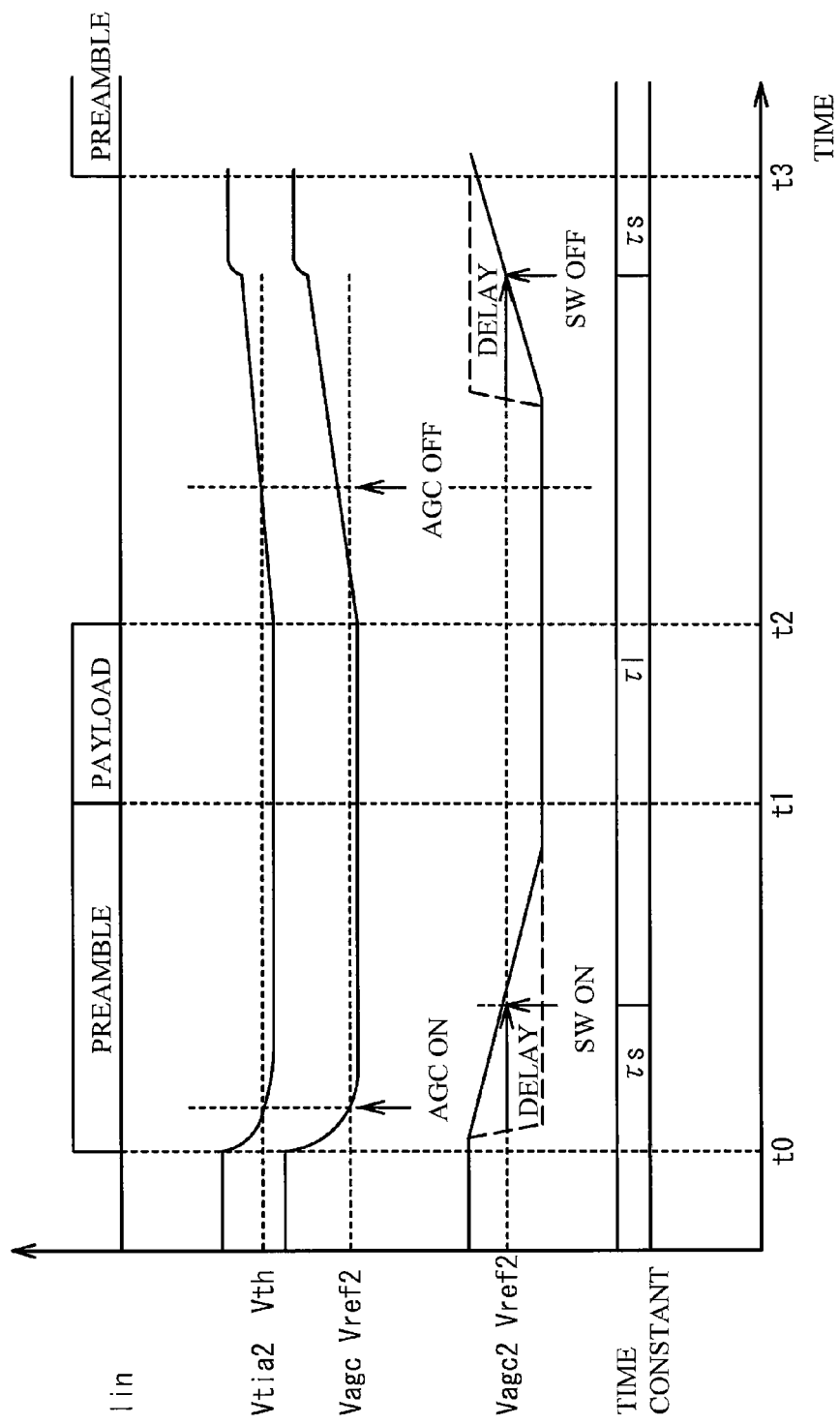
FIG. 9 is a timing chart of an operation of the amplifier circuit in accordance with the second embodiment.

FIG. 9 is a timing chart of an operation of the second embodiment. FIG. 9 illustrates the input signal Iin, the signal Vtia2, the control signal Vagc, the signal Vagc2 and the time constant of the hold circuit 25 with time. The broken line of the signal Vagc2 is virtually depicted in the absence of the delay circuit 36. At time t0, the time constant control signal Vsw is high, and the time constant is the small period τs. The signal Vagc2 lags behind the control signal Vagc. Thus, as compared to the case illustrated in FIG. 7 in the first embodiment, it delays times for the switch SW to turn ON and OFF. That is, the time it takes for the time constant to change τl from τs is delayed more than that in the first embodiment, and the time it takes for the time constant to change to τs to τl is delayed more than that in the first embodiment.

In the first embodiment, the control signal circuit 20 starts to operate with the small period of the time constant τs. After that, the time constant of the control signal circuit 20 is changed to the large period of τl. It is thus possible to stabilize the automatic gain control. In the second embodiment, the time constant is changed at the delayed timings. Thus, the control signal circuit 20 fully operates in the state with the small period τs, and thereafter, the time constant of the control signal circuit 20 is changed to the large period of τ1. It is thus possible to more reliably stabilize the automatic gain control.

According to the second embodiment, the time constant control circuit 30 increases the resistance value of the variable resistor R1 so as to exceed the resistance value in the initial state when a predetermined period of time passes after the output signal Vtia changes beyond the predetermined quantity from the initial state. It is thus possible for the time constant control circuit 30 to increase the resistance value of the variable resistor R1 so as to exceed the resistance value in the initial state after the bypass circuit 40 allows the input signal Iin to flow therein. The time constant control signal can be generated on the basis of the signal obtained by delaying the output signal of the control signal circuit 20. It is thus possible to set the time constant of the hold circuit 25 to the small period at the time when the automatic gain control is initiated.

Third Embodiment

Figure 10:
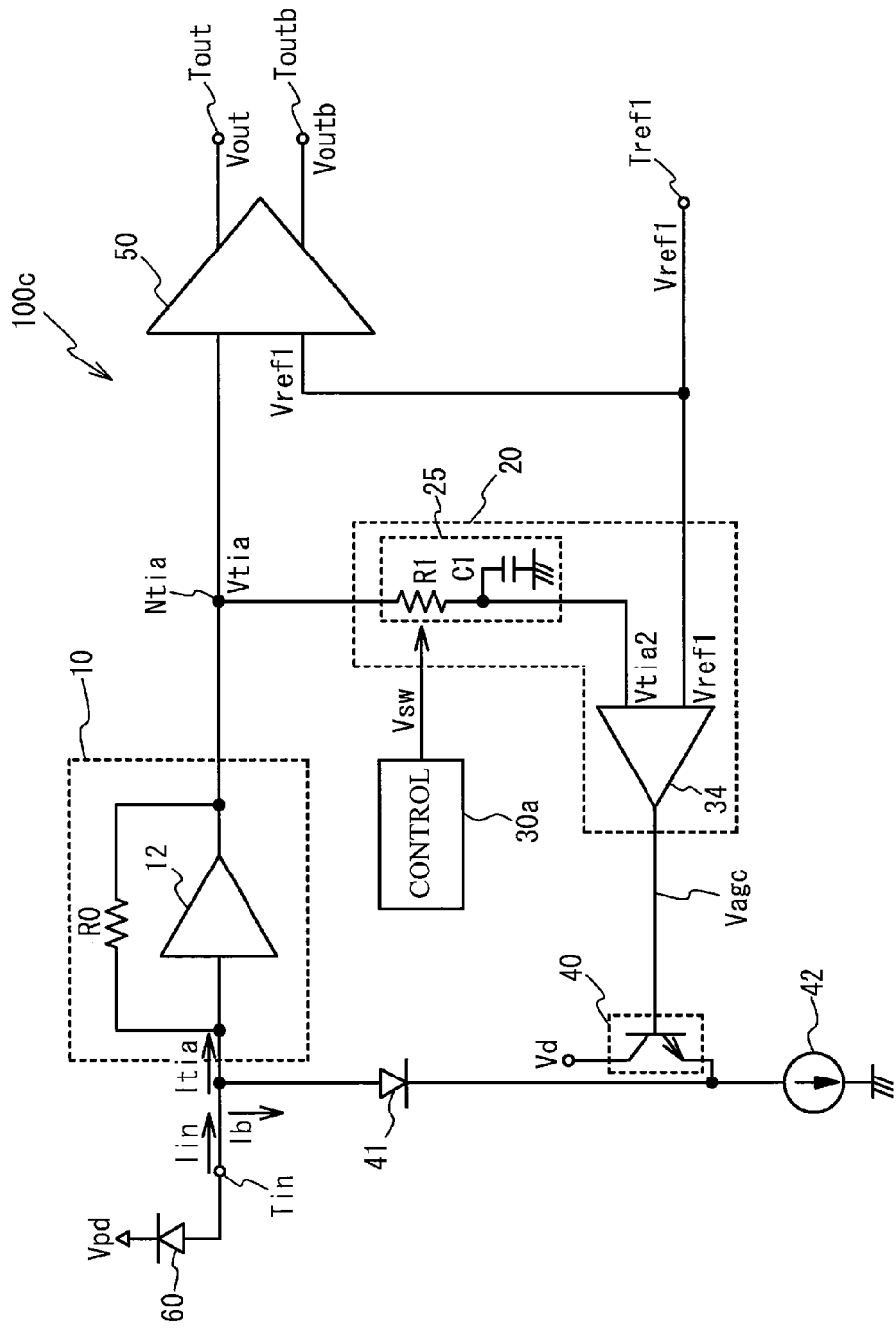
FIG. 10 is a circuit diagram of an amplifier circuit in accordance with a third embodiment.

FIG. 10 is a circuit diagram of an amplifier circuit 100c in accordance with a third embodiment. A time constant control circuit 30a is not provided with the output signal of the control signal circuit 20. In the third embodiment, the time constant control circuit 30a detects a situation in which the input signal enters in the second half of the preamble period or the payload period, and increases the time constant of the hold circuit 25. As in the case of the first and second embodiments, the time constant control circuit 30 may utilize the output of the control signal circuit 20 in order to control the time constant of the hold circuit (composed of the resistor R1 and the capacitor C1) of the control signal circuit 20. That is, the time constant control signal Vsw may be generated on the basis of the output of the control signal circuit 20. The time constant control circuit 30a may control the time constant independently of the control signal circuit 20.

According to the first through third embodiments, the control signal circuit 20 includes the hold circuit 25 in which the time constant is varied on the basis of the time constant control signal Vsw. The control signal circuit 20 generates the control signal Vagc that controls the bypass circuit 40 that allows the input signal Iin to flow therein so as to bypass the transimpedance amplifier 10. Since the time constant of the hold circuit 25 is variable, the time constant of the control signal circuit 20 can be appropriately controlled responsive to the input signal.

The time constant control signal Vsw is controlled so as to decrease the time constant of the hold circuit 25 in the initial state in the communication signal, and is then controlled so as to increase the time constant. It is thus possible to stabilize the control signal Vagc during the period of the preamble and increase the time constant of the hold circuit 25 in the period of the payload.

The first through third embodiments are configured to have the hold circuit 25 composed of the resistor R1 and the capacitor C1 and to change the time constant by changing the resistance value of the resistor. The hold circuit 25 may be any hold circuit capable of changing the time constant, and may, for example, be a low pass filter. The time constant of the hold circuit 25 may be changed by a parameter other than the resistance value of the resistor R1. For instance, the capacitance value of the capacitor C1 may be used to change the time constant of the hold circuit 25.

The present invention is not limited to the specifically disclosed embodiments, but may include other embodiments and variations without departing from the scope of the present invention.

What is claimed is:

1. An electronic circuit comprising:
a transimpedance amplifier;
a bypass circuit that allows a part of an input signal to be applied to the transimpedance amplifier to flow through the bypass circuit so as to bypass the transimpedance amplifier on the basis of a control signal;
a control signal circuit that includes a hold circuit having a time constant that is variable on the basis of a time constant control signal; and
the time constant control signal being related to the control signal generated by the constant signal circuit.

2. The electronic circuit as claimed in claim 1, wherein the time constant control signal reduces the time constant of the hold circuit in an initial state of the input signal and increases the time constant in a state following the initial state.

3. The electronic circuit as claimed in claim 1, wherein the time constant control signal is related to a signal obtained by delaying the control signal generated by the constant signal circuit.

4. The electronic circuit as claimed in claim 1, wherein the hold circuit includes a resistor and a capacitor, and the time constant of the hold circuit is variable by changing a resistance value of the resistor.

5. The electronic circuit as claimed in claim 1, wherein the control signal circuit includes a comparator comparing an output signal of the hold circuit with a threshold level, and the control signal circuit generates the control signal that starts to allows the part of the input signal to be applied to the transimpedance amplifier to flow through the bypass circuit when the output signal of the hold circuit exceeds the threshold level.

6. The electronic circuit as claimed in claim 1, wherein the input signal includes a data train having a preamble period and a payload period following the preamble period; and
the time constant control signal decreases the time constant of the hold circuit in the preamble period and increases the time constant in the payload period.

7. The electronic circuit as claimed in claim 1, wherein the input signal has an input signal period and an interval period, and the time constant of the hold circuit is reset in the interval period.

* * * * *